(12) United States Patent
Mori et al.

(10) Patent No.: US 8,362,479 B2
(45) Date of Patent: Jan. 29, 2013

(54) SEMICONDUCTOR MATERIAL

(75) Inventors: Kiyotaka Mori, Cambridge (GB); Henning Sirringhaus, Cambridge (GB)

(73) Assignees: Panasonic Corporation, Osaka (JP); Cambridge Enterprise Ltd., Cambridgeshire (GB)

( * ) Notice: Subject to any disclaimer, the term of this patent is extended or adjusted under 35 U.S.C. 154(b) by 77 days.

(21) Appl. No.: 12/986,535

(22) Filed: Jan. 7, 2011

(65) Prior Publication Data
US 2011/0101344 A1    May 5, 2011

Related U.S. Application Data

(63) Continuation of application No. PCT/GB2008/002471, filed on Jul. 18, 2008.

(51) Int. Cl.
*H01L 29/10*    (2006.01)

(52) U.S. Cl. ........ 257/43; 257/49; 257/E21.04; 257/E29.003; 438/104; 438/478; 977/938; 977/840

(58) Field of Classification Search ............. 257/43, 257/49, E21.04, E29.003; 438/104, 478; 977/938, 840
See application file for complete search history.

(56) References Cited

U.S. PATENT DOCUMENTS

| | | | |
|---|---|---|---|
| 7,067,867 B2 * | 6/2006 | Duan et al. ............ 257/296 |
| 7,087,920 B1 | 8/2006 | Kamins |
| 7,218,004 B2 | 5/2007 | Pan et al. |
| 7,915,646 B2 | 3/2011 | Takizawa et al. |
| 2005/0161662 A1 | 7/2005 | Majumdar et al. |
| 2006/0205240 A1 | 9/2006 | Pan et al. |
| 2010/0264403 A1 | 10/2010 | Sirringhaus et al. |
| 2011/0073910 A1 | 3/2011 | Takizawa et al. |

FOREIGN PATENT DOCUMENTS
WO    2007/017689    2/2007

OTHER PUBLICATIONS

International Search Report and Written Opinion dated Nov. 17, 2008 issued in respect to PCT/GB2008/002471.

* cited by examiner

*Primary Examiner* — Kimberly Rizkallah
*Assistant Examiner* — Timor Karimy
(74) *Attorney, Agent, or Firm* — Greenblum & Bernstein, P.L.C.

(57) ABSTRACT

A semiconductor device which comprises a channel layer formed from a semiconductor channel component material in the form of crystalline micro particles, micro rods, crystalline nano particles, or nano rods, and doped with a semiconductor dopant.

22 Claims, 6 Drawing Sheets

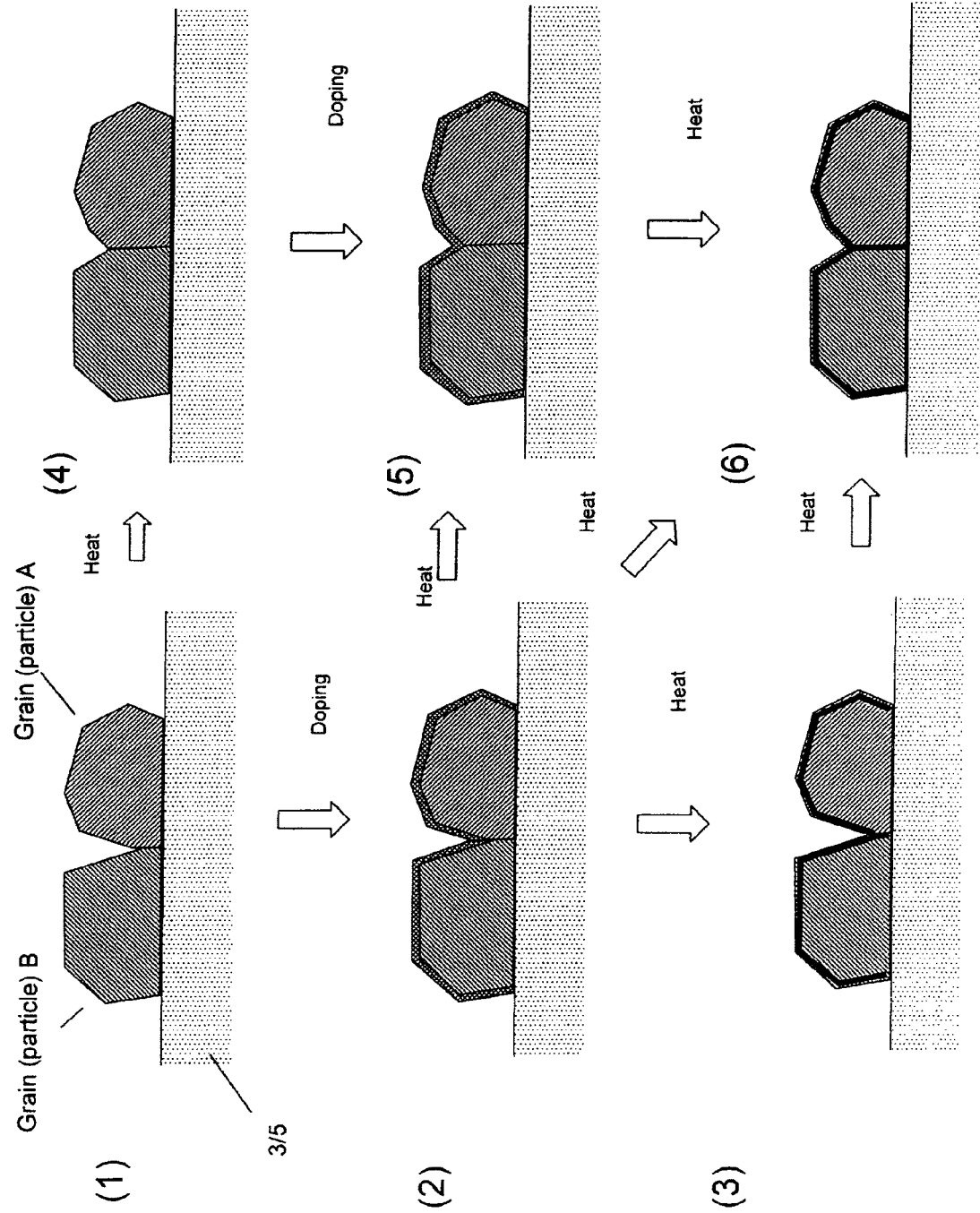

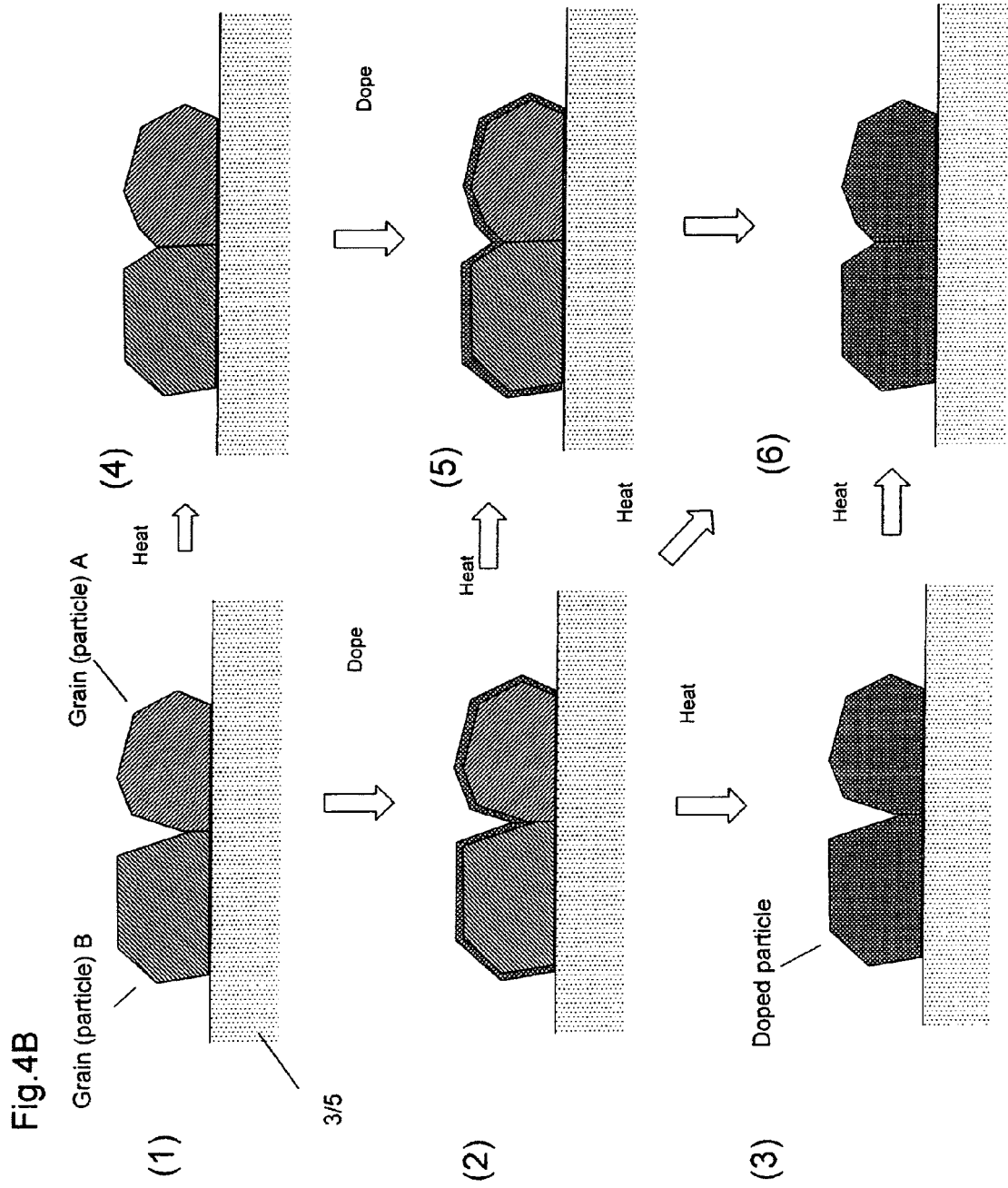

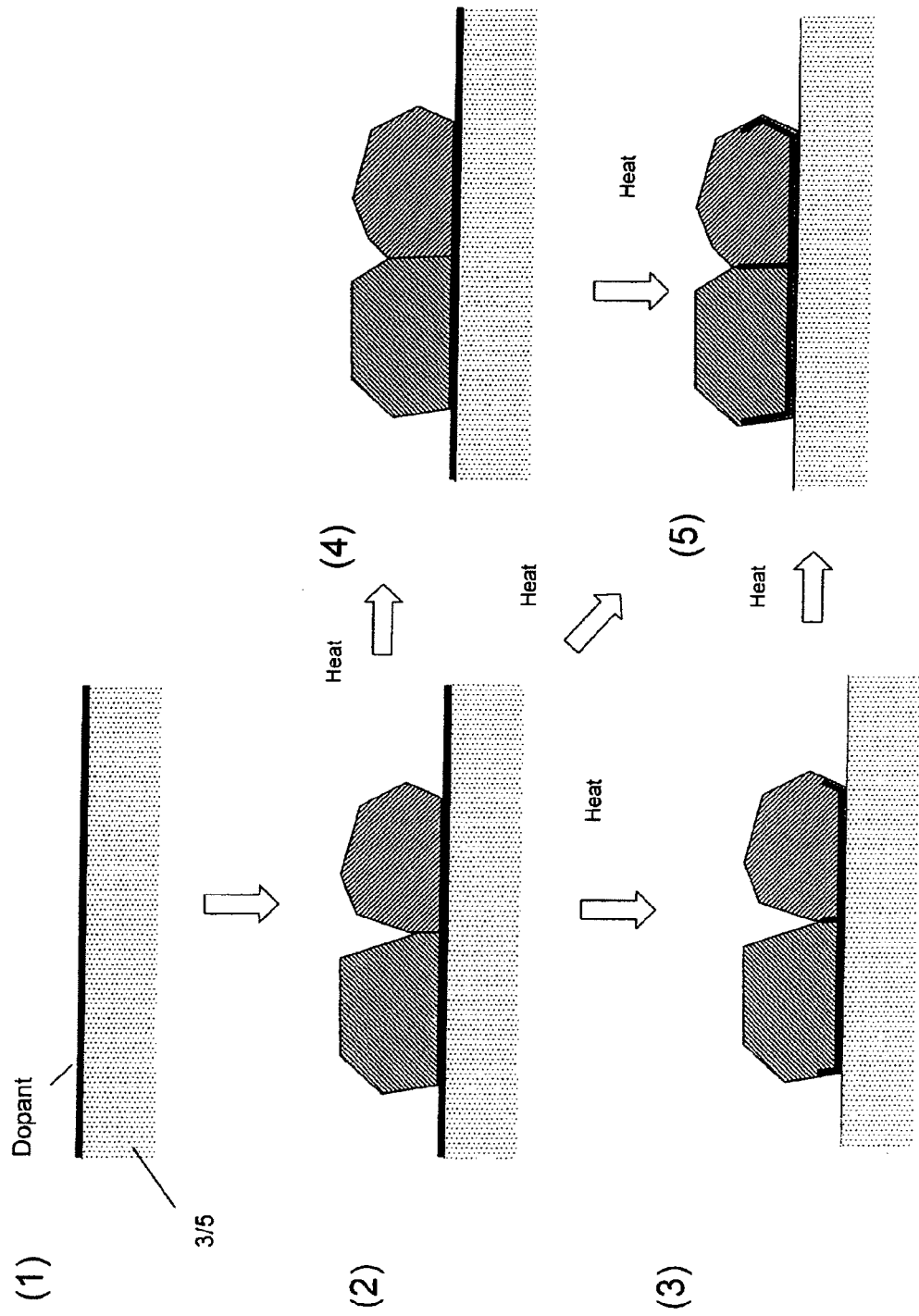

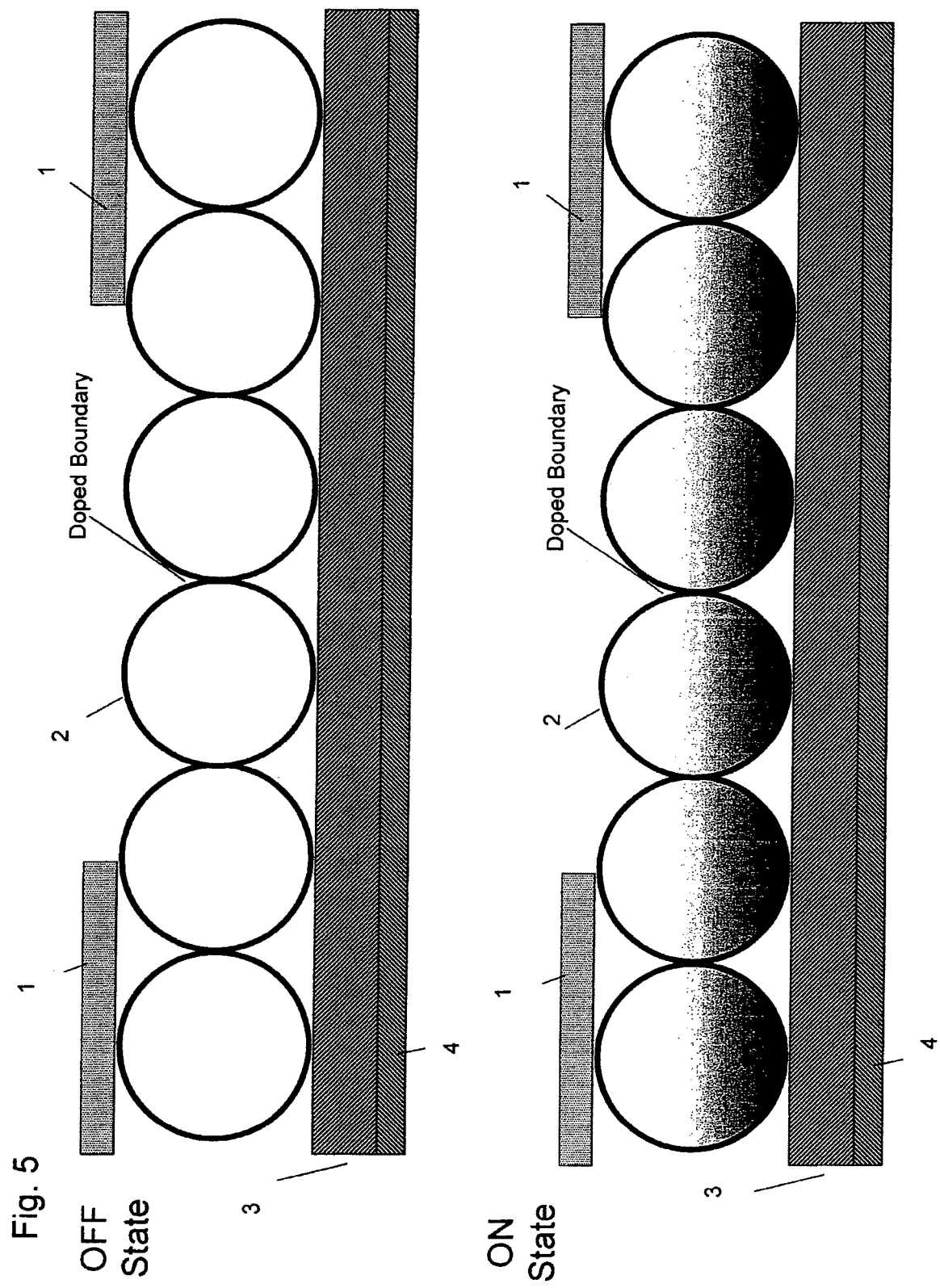

SEMICONDUCTOR MATERIAL

CROSS REFERENCE TO RELATED APPLICATIONS

This is a continuation application of PCT Application No. PCT/GB2008/002471, filed Jul. 18, 2008, designating the United States of America, the disclosure of which, including the specification, drawings, and claims, is incorporated herein by reference in its entirety.

The present invention relates to the manufacture of semiconductor material. In recent years there have been significant improvements in respect of the manufacture of semiconductor materials for use in thin film transistor (TFT) devices, photovoltaic devices or diode devices that can be used in displays or other electronic devices.

One approach to improving the manufacture of structures has been to provide micro or nano particles and process them to provide a semiconductor channel layer for use in the above devices. In such arrangements the particles are formed and are processed such that the particles are in good contact with adjacent particles by use of sintering, fusion, annealing or similar processes. Electrodes are provided in context with material to form a device. In some cases it has been proposed to use nano rods of semiconductor material or microcrystalline structures, but in all cases it is important to have good contact between the particles so that charge can flow through the channel layer that they provide.

An important characteristic of the channel for example for TFT that is provided is that has a high on-current which is achieved with a low channel resistance. To achieve this it has been appreciated that the quality of the particles that are provided is important, but in recent times it has also become apparent that the boundary between adjacent particles plays a significant role. For example, the boundary can have a high resistance and can also contain a large number of trap states which trap flowing charge, affecting the end device in unpredictable and unwanted ways.

Attempts have been made to improve the boundary between particles in order to overcome some of the problems associated with this boundary issue. For example, in U.S. Pat. No. 7,218,004 there is disclosed an arrangement in which nano structures (in this case nano rods) are processed to form a semiconductor channel by coating them in a bonding formulation of similar kind of component with nano structure. This undoubtedly provides the opportunity to improve the characteristics of the resulting semiconductor channel, but does still exist significant problems in terms of provision of controlled improvement of the boundary between individual rods of material.

Accordingly, there is still a need for an improved manufacturing process and resultant semiconductor channel product which attempts to optimise the boundary between particles forming the semiconductor layer whilst still maintaining high quality semiconducting properties.

According to the present invention there is provided a method of forming a channel of semiconductor material for use in a thin film device, the method comprising the steps of:

providing a channel component material in the form of micro particles, nano particles or nano rods;

doping the particles or rods using a semiconductor dopant; and processing the particles or rods to form a channel where the boundaries of adjacent particles or rods are doped.

There are many kinds of dopants for semiconductors that can be used and which are known to the one skilled in art. For example, for metal oxide semiconductor such as ZnO, Al is a well known as dopants, but the invention is not limited to those. For a metal oxide semiconductor, as described before, metals and non-metals work as the donor (acceptor for p-type) dopant. In case of metal dopant, it is preferred to select metals for the dopant having electron affinity higher by more than 0.05 eV than the semiconductor main body.

The semiconductor material can be an elemental semiconductor and preferably selected from group IVb element such as silicon, germanium, Carbon, or Sn where the dopant can be P, As, Sb, B, Al, Ga as industrially well used. Even though it is said elemental semiconductor, SiGe can also be selected. In another case, the semiconductor material can be a compound semiconductor such as a chalcogenide, a carbide, a nitride or metal oxide compound. One preferred example for a chalcogenide is based on CuInGaSe family but not limited to this. One example for a carbide is selected from SiC family. One example for a nitride is selected from GaN family. One example for metal oxide is selected from In based oxide, Zn based oxide, Sn based oxide, Sb based oxide, Cu based oxide, or multimetal oxide of above mentioned metal oxides. In another example of semiconductor material is III-V compound such as GaAs, GaSb, GaP, InP, AlN, or BN.

The device comprising of the semiconductor material in the invention may be a thin film transistor, photovoltaic device or light emitting diode device. The channel component material may have a polycrystalline such as microcrystalline. In another example, crystalline nanoparticles are used as original material. The boundary or surface into which dopant is diffused becomes amorphous yet maintains crystallinity in the core bulk of the nanoparticle. This makes the channel component material consists of crystalline core and amorphous shell, and therefore, one can call this as polymorphous as it resembles a crystalline phase embedded in an amorphous matrix.

The size of semiconductor particles or nanorods is preferably above 1 nm and up to 100 nm in one dimension, and in some case it may go up to 500 nm.

The doping may just be applied to the surface of the component material, or may be applied in bulk throughout the material. The degree and depth of doping can be controlled by time and/or temperature when one utilize diffusion of dopant. In one case, the doping concentration may have gradient in the direction of film thickness. One example of advantages of this gradient in concentration is to have backchannel control. In some case, it is preferred to have less conductivity in the backchannel comparing to the channel in order to suppress off-current leakage in thin film transistor. In another example, high concentration of dopant in one side may help reducing contact resistance with source or drain electrodes in thin film transistor. In another example for diode device, one side which may have higher (or lower) doping concentration is preferable for charge injection or extraction.

The final treatment step may include sintering or fusion bonding, for example. However, in many cases, this step can coincidentally occur in the doping process where some heat treatment at elevated temperature is applied.

Just so long as excessive levels of doping are not provided, such that the outer surfaces of the particles become completely metallic, the present invention provides an arrangement in which the boundary between adjacent particles is greatly improved in contact and control terms to improve the efficiency of the channel that is formed. In a device such as TFT of the invention it is therefore possible to provide a far more efficient device, potentially of higher mobility, lower sub-threshold slope, a higher on/off ratio and increased reliability.

One example of the present invention will now be described with reference to the accompanying drawings, in which:

FIG. 4 is a series of schematic diagrams showing semiconductor channel layers being formed for use in the present invention; and FIG. 5 is a schematic diagram showing a thin film transistor device in accordance with the invention.

Figure 1:
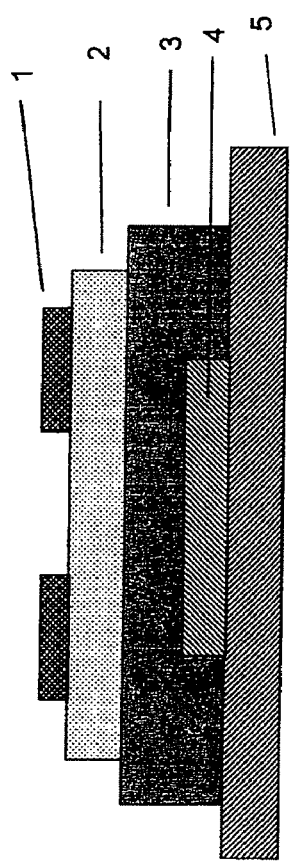
FIG. 1 is a schematic view of components in a device of the invention.
Figure 2:
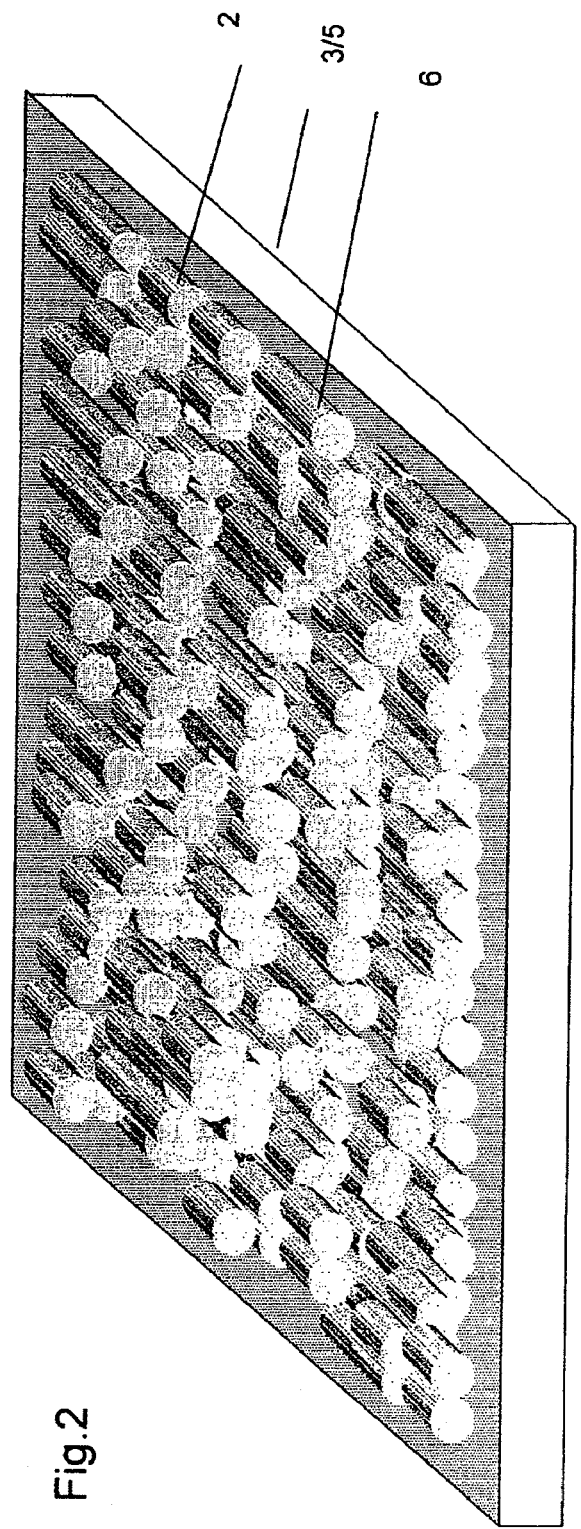
FIG. 2 is a schematic diagram showing a substrate and channel according to the prior art.
Figure 3:
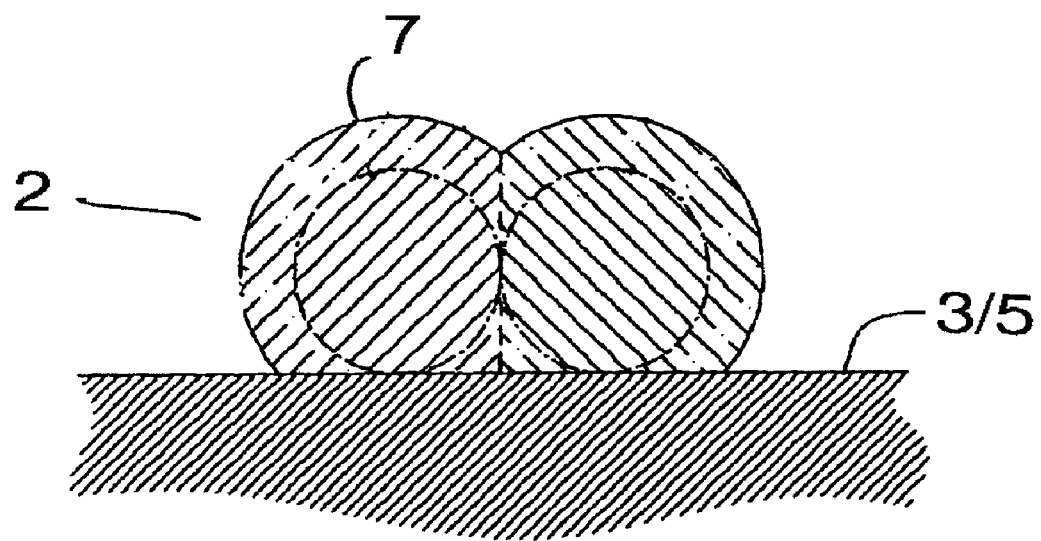
FIG. 3 is a schematic diagram showing channel components formed by prior art method.

Referring to FIG. 1, a schematic side view of a device in accordance with the present invention is shown. In this case a thin film transistor (TFT) device is shown, although it will be appreciated that the same production principles taught herein can be applied to create other devices, such as a diodes or photovoltaic devices. In FIG. 1 there are shown source and drain contacts 1 placed on the surface of a semiconductor channel 2. The semiconductor channel 2 is, in this case provided on a gate insulator 3 which is in contact with gate electrode 4 and a base substrate 5. This general structure is well known in the art, and FIG. 2 shows a side perspective view of one general structure that is known for forming the semiconductor channel 2. In this figure the channel 2 is formed on insulator 3 or substrate 5 by the provision of microparticles, nano particles or (as actually shown) nano rods 6. The channel material is then bonded together by fusing, annealing or other techniques to form the semiconductor channel structure 2, although in cases where the particles are small enough, owing to surface energy of the particle, they may fuse each other by themselves without application of excessive heat. As can be seen from FIG. 3, in some prior art arrangements the channel component 6 is coated with a contact material 7 to improve the bonding and contact characteristics between adjacent parts of the material. As mentioned above, however, such a structure has problems in that it is still difficult to control the conductivity of the boundary as the contact material consists of the same or similar material to that of the core portion. In such prior art in the channel there still exists a boundary with high resistivity or large number of trap states.

In a device formed in accordance with the present invention the semiconductor channel 2 is formed as follows. As with earlier prior art devices a base channel material is provided in the form of microparticles, nano particles or nano rods. As explained above, material may be microcrystalline in structure, nanocrystalline in structure, or may even be a combination of micro and nano crystalline structures. The materials that can be employed include elemental semiconductor materials such as silicon and germanium, or can be one of any well known compound semiconductor structure.

FIGS. 4A to 4C show a number of alternative approaches to processing the core semiconductor channel material to achieve the device of the present invention. Each of these processes employs the core concept of doping of the channel component material to improve bonding characteristics and control the overall performance of the semiconductor channel that is formed.

The dopant concentration will depend upon the application, and dopant concentration determines carrier concentration in a semiconductor. For a TFT application, carrier concentration needs to be in the range of modulation limit of gate component of the device. Typical range of the modulation is possible between 10E14-10E19/cm3, more preferably 10E15-10E18/cm3, however, with thin (a few nm) and/or high-k (dielectric constant >10 up to typically several hundred) gate insulators, carrier concentration above 10E19/cm3 is possible to be modulated by the gate.

The doping may be performed by applying a doping solution to the material, on to the surface of the substrate or may be a vacuum-based method. If the semiconductor material is a multi-component semiconductor material then an oxygen or metal deficiency-type approach to doping can be employed as appropriate. In one example for ZnO, nanoparticles are heat treated in an inert atmosphere or in vacuum at elevated temperature of 100-300 degree C. to form oxygen vacancies which act as dopant for ZnO semiconductor material. The doping can be formed so as to be activated as part of the doping process, or, alternatively, may be activated as a separate step by thermal, optical (i.e. UV irradiation for ZnO in an inert atmosphere or in vacuum) or other means.

The doping process in many cases requires elevated temperature to activate the dopant. It often relies on diffusion of dopant material(s) along surface or boundary where the dopant penetrates into the nanoparticle. The temperature required for this process depends on diffusion coefficient of dopant on the surface, on the boundary as well as in the core bulk of the nanoparticle. One example, for a metal oxide semiconductor such as ZnO, Al dopant in the form of metal precursor can be doped in the surface as well as boundary in a temperature range of 200 degree C. to 350 degree C. in ambient pressure with ambient environment. In another example, in the case of semiconductor component as Si, the temperature to diffuse and activate the dopant is typically in the range of 700-1100 degree C. in inert atmosphere such as Ar/H2.

In the case where a solution process is selected for a metal dopant, a metal precursor such as metal alkoxide, metal halide, metal hydroxide and metal acetate which may be dissolved in solvent when applied. In addition, metal nanoparticles dispersed in solution can be used as dopant source for such a solution process. Application of such dopant solution can be any kind of printing method including dipping process. As in most of the cases above, heat may be required to decompose the precursor and diffuse metals into the boundary as well as the semiconductor. The heat applied is typically above room temperature up to a few hundred degrees C. depending on source of dopant. Specific condition for this process is described elsewhere in this specification.

Metal precursor or nano particle sources can be vacuum deposited if appropriate as well. In the case of a vacuum process, one can deposit thin metal dopant preferably equal or less than 1 nm onto the semiconductor nano particles and then diffuse by for example a heat treatment. For example, a thin layer of Al is deposited onto ZnO nanoparticles and then diffuses into the nanoparticles at elevated temperature of 200-400 degree C., preferably in an inert atmosphere.

In some semiconductors such as metal oxide, oxygen vacancy may be used as the dopant. This can be done by annealing the nanoparticles before or after film formation in inert gas such as $N_2$ or Ar, or in vacuum environment.

In the process of FIG. 4A particles of the semiconductor compound material that are to form the channel are placed on the substrate 5 or gate insulator 3. Following on from this the device can be processed via one of two routes. Either doping can be applied to the channel material to dope the surface of the particle or the particles can be treated through sintering, annealing or other technique to bond them together. Whichever of these two steps is performed first, the other can then follow to produce an intermediate stage as shown in step 5 of FIG. 4A. In some cases, this intermediate stage will be the final component. Following on from this the heat activation of the doped layer in step 5 is performed to provide the resultant channel layer component as shown in step 6. As an alternative, if doping is performed at an initial stage it may be that heat activation of the doping occurs followed by sintering, annealing or other bonding process to again arrive at the resultant step 6.

FIG. 4B shows a similar approach but for a case where not only the surface of the semiconductor channel component is doped, but the entire component particles are is doped in a bulk doping manner. As before, doping may occur as an additional step, or following on from a bonding step. However, whichever of the alternatives, the same end result is provided of a channel formed from doped and bonded particles of the channel-forming component material.

FIG. 4C shows a further alternative approach in which doping material is applied to the surface of the substrate or gate insulator 5, 3 prior to application of the semiconductor compound onto the surface of the substrate insulator 5, 3. Following on from this the semiconductor compound can either be treated to perform bonding and then heated to achieve doping or heated to achieve doping followed by a bonding step.

FIG. 5 shows the end result device in schematic form. Here the source/drain contacts 1, gate insulator 3, metal contact 4 are shown as in FIG. 1, with the semi conductor channel 2 being shown in schematic form as a series of individual particles of materials bonded and doped to provide a doped boundary between them. In the off state shown on the upper part of FIG. 5, there is no accumulated charge in the layer 3. However, in the on state shown in the lower half of this figure the accumulated charge is shown in individual particles in the channel layer 2, with such charge spread evenly given the effective boundary contact and controlled levels of semiconductor doping that can be provided with the present invention. A single particle layer is shown in FIG. 5, however, the invention is not limited to single layer and the layer may be several particles in thickness as shown in FIG. 2. In such a case an accumulation layer may be formed over the first single particle layer or a few particle layers in thickness in the case that the particles are small enough compared to the size of accumulation layer, which is typically less than 5 nm in a TFT device.

The invention claimed is:

1. A semiconductor device comprising:
   a channel layer formed from a semiconductor channel component material in the form of crystalline micro particles, micro rods, crystalline nano particles, or nano rods; and
   electrodes which are electrically coupled to the channel layer,
   wherein the channel layer includes at least one boundary between adjacent crystalline micro particles, micro rods, crystalline nano particles, or nano rods,
   each of the crystalline micro particles, the micro rods, the crystalline nano particles, or the nano rods include:
      a core which contains the semiconductor channel material; and
      a shell which contains the semiconductor channel component material and is arranged around the core, only the shell being doped with a semiconductor dopant, the doped shell comprised in the at least one boundary,
   wherein the at least one boundary has a lower electrical resistivity than intrinsic boundary resistivity, and
   wherein the channel layer has a gradient in a semiconductor dopant concentration such that, in a direction of a channel thickness, conductivity in a backchannel of the channel layer is less than conductivity in a channel of the channel layer.

2. A semiconductor device according to claim 1, wherein the boundary between crystalline particles comprises crystalline material.

3. A semiconductor device according to claim 1, wherein the boundary between crystalline particles comprises amorphous material.

4. A semiconductor device according to claim 1, wherein the device is one of a thin film transistor, diode, or photovoltaic device.

5. A semiconductor device according to claim 1, wherein the semiconductor channel component material is a crystalline structure, a microcrystalline structure, a nanocrystalline structure, polymorphous structure, or a mixture thereof.

6. A semiconductor device according to claim 1, wherein the semiconductor channel component material is one of an elemental or compound semiconductor.

7. A semiconductor device according to claim 6, wherein the elemental semiconductor is composed of one of the group IVb elements.

8. A semiconductor device according to claim 1, wherein the compound semiconductor is composed of one of an oxide-compound, a carbide-compound, or a nitride-compound.

9. A semiconductor device as claimed in claim 1, wherein said channel comprises a metal oxide semiconductor comprising a first metal atom, and said semiconductor dopant comprises a second metal atom, and wherein the electron affinity of said first metal atom is higher by more than 0.05 electron volt than the electron affinity of said second metal atom.

10. A method of forming a channel of semiconductor material for use in a thin film device, the method comprising the steps of:
   providing channel component material in the form of crystalline micro particles, micro rods, crystalline nano particles or nano rods, each of which include a core and a shell, both of which contain the semiconductor material;
   processing the particles or rods to form a channel layer such that the adjacent particles or rods are in contact with one another at at least one boundary, the at least one boundary containing shells of the crystalline micro particles, micro rods, crystalline nano particles or nano rods;
   doping only the shells of the crystalline micro particles, micro rods, crystalline nano particles or nano rods by bringing the channel layer into contact with a semiconductor dopant such that the at least one boundary has a lower electrical resistivity than intrinsic boundary resistivity, and
   coupling electrodes to the channel layer.

11. A method according to claim 10, wherein the device is one of a thin film transistor, diode, or photovoltaic device.

12. A method according to claim 10, wherein the channel component material is a crystalline structure, a microcrystalline structure, a nanocrystalline structure, polymorphous structure, or a mixture thereof.

13. A method according to claim 10, wherein the semiconductor component material is one of an elemental, or compound semiconductor.

14. A method according to claim 10, wherein the doping step is one of bulk or surface doping.

15. A method according to claim 10, wherein the processing step comprises one of fusing or sintering the channel component material.

16. A method according to claim 10, wherein the step of doping only the shells comprises depositing a liquid containing said semiconductor dopant.

17. A method according to claim 14, wherein the semiconductor material is a metal oxide comprising a first metal atom, and said liquid comprises a second metal atom with an electron affinity that is at least more than a 0.05 electron volts lower than the electron affinity of the first metal atom.

18. A method according to claim 17, wherein said semiconductor material is ZnO, and wherein said second metal atom is Al.

19. A method according to claim 10, wherein the step of doping only the shells comprises influencing the degree and depth that the semiconductor dopant diffuses into the crystalline micro particles, micro rods, crystalline nano particles or nano rods by controlling the time and/or temperature of doping.

20. A method according to claim 19, wherein the time and/or temperature of doping are controlled to provide a gradient in doping concentration in the direction of channel layer thickness.

21. A method according to claim 10, wherein the at least one boundary between crystalline particles comprises crystalline material.

22. A method according to claim 10, wherein the at least one boundary between crystalline particles comprises amorphous material.

* * * * *